(12) United States Patent
Aberg et al.

(10) Patent No.: US 7,583,504 B2
(45) Date of Patent: Sep. 1, 2009

(54) COOLING ASSEMBLY

(75) Inventors: Goran Aberg, Stockholm (SE); Karl Gunnar Malmberg, Haninge (SE)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 0 days.

(21) Appl. No.: 12/093,161

(22) PCT Filed: Nov. 11, 2005

(86) PCT No.: PCT/SE2005/001713

§ 371 (c)(1),
(2), (4) Date: May 9, 2008

(87) PCT Pub. No.: WO2007/055625

PCT Pub. Date: May 18, 2007

(65) Prior Publication Data

US 2008/0266808 A1   Oct. 30, 2008

(51) Int. Cl.
*H05K 7/20* (2006.01)

(52) U.S. Cl. .............. 361/709; 361/702; 361/704; 361/719; 165/80.3; 257/718; 257/719; 174/16.3; 174/252

(58) Field of Classification Search ......... 361/702–712, 361/715, 717–722, 725–728, 732, 740, 735, 361/741, 742, 747, 748, 756, 790, 801, 807, 361/809, 810, 816, 818; 257/686, 798, 706–727; 174/16.1, 16.3, 250–263; 165/80.2–80.5, 165/104.33, 185; 24/289, 458; 248/505, 248/510
See application file for complete search history.

(56) References Cited

U.S. PATENT DOCUMENTS

| | | | | |
|---|---|---|---|---|
| 5,430,611 A * | 7/1995 | Patel et al. | .......... | 361/705 |
| 6,046,905 A * | 4/2000 | Nelson et al. | .......... | 361/704 |
| 6,386,890 B1 * | 5/2002 | Bhatt et al. | .......... | 439/67 |
| 6,442,045 B1 * | 8/2002 | Goodwin et al. | .......... | 361/816 |
| 6,456,490 B1 * | 9/2002 | Lai | .......... | 361/679.54 |
| 6,459,582 B1 * | 10/2002 | Ali et al. | .......... | 361/704 |
| 6,545,879 B1 * | 4/2003 | Goodwin | .......... | 361/807 |
| 6,743,026 B1 * | 6/2004 | Brodsky | .......... | 439/73 |
| 7,042,727 B2 * | 5/2006 | Ulen et al. | .......... | 361/704 |
| 7,275,939 B2 * | 10/2007 | Byquist et al. | .......... | 439/73 |
| 7,286,371 B2 * | 10/2007 | Unrein | .......... | 361/810 |
| 7,428,154 B2 * | 9/2008 | Ishimine et al. | .......... | 361/704 |
| 7,450,400 B2 * | 11/2008 | Boudreaux et al. | .......... | 361/809 |

* cited by examiner

*Primary Examiner*—Michael V Datskovskiy

(57) ABSTRACT

A method and apparatus for cooling an electronic application having at least one heat-generating electronic component mounted on a circuit board. A heat transferring heat sink is attached to the circuit board in thermal contact with one heat generating electronic component by first being statically fixed to the circuit board in a stationary position at a specified height above the circuit board, and then by resiliently biasing the component against the heat sink.

25 Claims, 6 Drawing Sheets

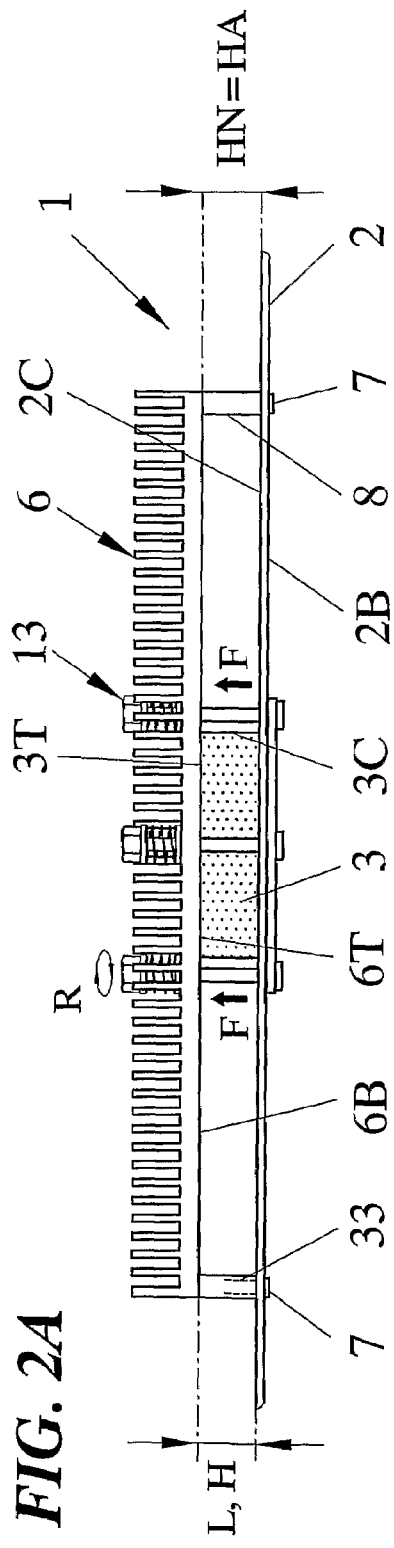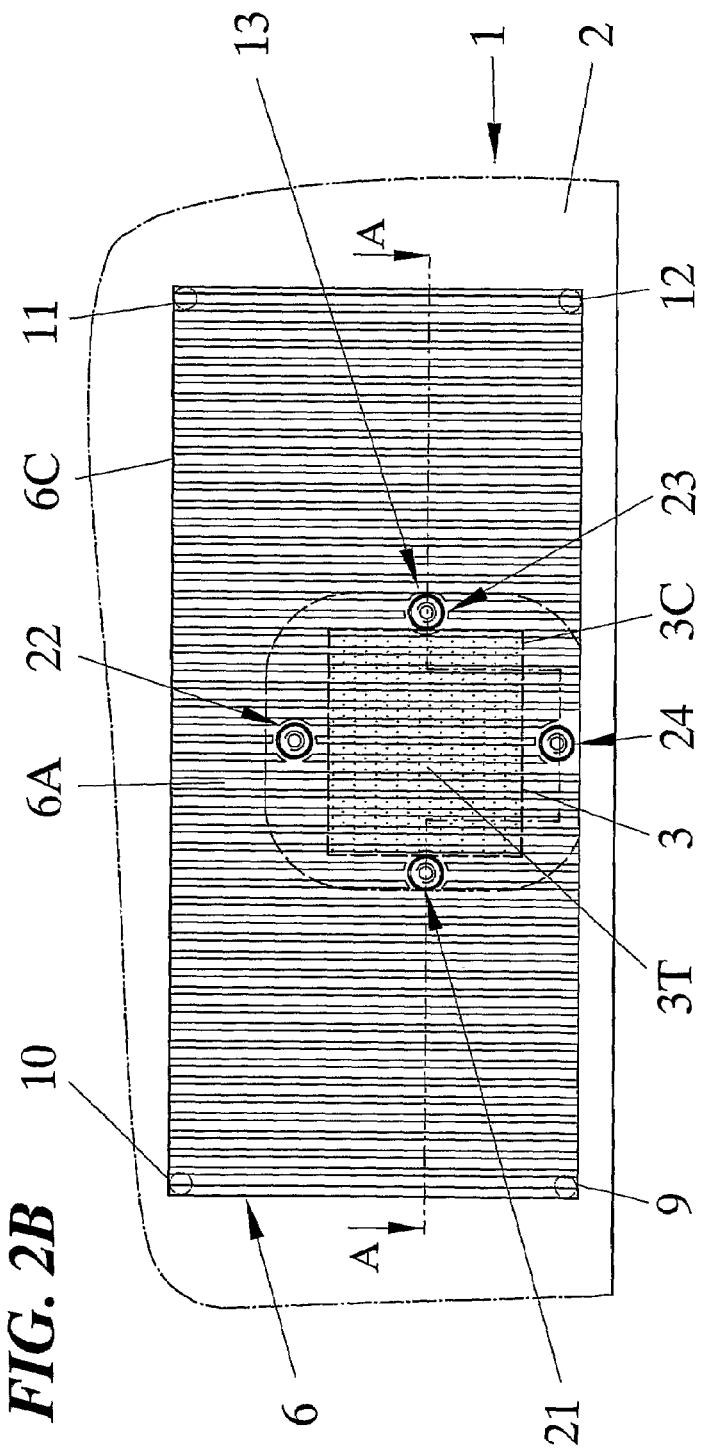

A-A

A - A

B - B

COOLING ASSEMBLY

TECHNICAL FIELD

The present invention generally concerns the cooling of heat generating electronic applications by means of heat sinks brought into heat transferring thermal contact with a printed circuit board (PCB) mounted heat generating component of the application.

BACKGROUND

Present day electronic applications commonly include PCB mounted components, such as chips or microprocessors, that generate much heat and that are also very sensitive to overheating and therefore require optimum cooling to be maintained at acceptable operating temperatures. One important prerequisite for achieving effective cooling is to optimize thermal contact between the component and the heat sink by minimizing thermal resistance of the joint between the heat transfer contact surfaces of the heat sink and the component. This is generally achieved with good surface structure and measurement precision and parallelism between the component and heat sinks surfaces. In theory, acceptable thermal resistance values would be achievable by securing flatness of as well as parallelism between the surfaces and by producing high surface finish for both surfaces. In practice, however, it would be far too expensive to produce a surface finish that would sufficiently reduce the interstitial air caught in gaps formed between the contact points of even polished surfaces.

Although good surface structure can be achieved by machining, e.g. of the commonly used aluminum heat sink, it is also a fact that in practical applications parallelism between the contact surfaces and height of the component surface above a PCB is often not very exact, being dependent on i.a. soldering joints. For the above reasons, it is common practice to improve the thermal contact by providing thermal interface material, such as thermal grease, thermal tape, thermal phase change material and various thermally conductive gap filler materials, between the contact surfaces to fill the microscopic gaps formed by the roughness of the surfaces and to thereby increase the heat transfer from the component to the heat sink. However, gap filler or other thermal interface material shall not be used to fill "large gaps" since the conductivity is not good enough. A gap-filler shall likewise not be used to compensate for dynamic changes of the gaps, caused e.g. by shock or vibration.

Thermal contact between heat sink and component is dependent also on the contact pressure, and in this context higher contact pressure means smaller gaps and hence better contact. Resilient clamp and/or spring attachments are therefore often used to hold together component and heat sink and to provide appropriate contact pressure for ensuring intimate thermal contact between the contact surfaces, without putting excessive load on either component or printed circuit board.

One problem associated with today's cooling assemblies for heat generating electronic applications is that the integrity of the thermal interface between the component and the heat sink may become disturbed or even destroyed both during transport of the application and during its operation. A cause of such problems is the dynamic dimensional changes that may occur in different environments, such as by differential thermal expansion/contraction or by changes in air humidity affecting plastic materials. Such problems may also occur if an application is subjected to mechanical shock during transport, in its normal operational environment, by accident or even caused by natural forces, such as assemblies operating in areas subjected to earthquakes. The problem is quite obviously aggravated in applications having small size highly heat generating components that for their cooling require comparatively large and heavy heat sinks. Due to the great mass of the heat sink and its large extension past the component contact surface, even moderate shock may destroy the intimate contact between the component and the heat sink and thereby be detrimental to the thermal interface there between.

SUMMARY

It is a general object of the present invention to provide effective and reliable cooling of applications of electronic equipment having heat generating components.

In particular, a basic object of the invention is to suggest a principle of electronic equipment cooling, providing long-time stable cooling with essentially maintained thermal resistance in the thermal interface between a component and a heat sink.

It is a specific object of the invention to provide an improved method of long time stable cooling of heat generating electronic component applications on a circuit board by means of a cooling assembly including a heat sink attached to the circuit board in heat transferring thermal contact with a heat generating electronic component and to provide an electronic application employing such improved cooling principles.

Another specific object of the invention is to provide an improved cooling assembly for long time stable cooling of heat generating electronic component applications on a circuit board, including a heat sink attached to the circuit board in heat transferring thermal contact with a heat-generating electronic component.

Another specific object of the invention is to provide an improved method of long time stable mounting of a cooling assembly to a printed circuit board for cooling heat generating electronic component applications on the PCB by means of a heat sink attached in heat transferring, thermal contact with a heat generating electronic component.

These and other objects are met by the invention as defined by the accompanying patent claims.

The invention concerns the removal of heat from a heat generating electronic component mounted on a PCB, by means of a heat sink attached to the PCB in thermal contact with said component. It has been recognized that the above objects are achieved by securing a controlled and uniform pressure between heat sink and heat generating component. A basic idea is to secure the heat sink to the PCB in a stationary position, at a fixed distance from said circuit board and to resiliently bias the component against the heat sink. This will provide inherent automatic compensation for dynamic dimensional changes as well as assembly tolerances and manufacturing tolerances of parts of the equipment by employing the resilience of the substrate of the PCB.

In accordance with a further aspect of the invention improved optimized cooling may also be achieved for applications having several further, closely mounted components. A basic idea of this aspect of the invention is to provide one separate heat sink for each of said further components and to use the heat sink of the main heat generating component to resiliently force said additional heat sinks against the further components. With this design, tolerance conflicts of the components may be avoided and individual optimization of the heat sinks for each component may be obtained.

By securing the heat sink to the PCB at discrete positions in an outer area of the heat sink, the attachment has a negligible affect on the total flow of cooling air between the heat sink and the PCB, so that effective cooling may be achieved also for other components that are not in direct heat transfer contact with a main heat sink.

Preferably, the heat sink is secured to the PCB in an outer peripheral area thereof and the biasing force is applied closely outside the component. This solution provides for a significant distance between the area where the heat sink is secured to the PCB and the area where the biasing force is applied, so that the flexibility of the PCB substrate may be effectively employed for tolerance and heat expansion compensation. Such a solution is also excellent for applications having a heat generating component requiring a very large and accordingly heavy heat sink.

In one embodiment that provides specifically good conditions for providing a controlled flexing of the PCB substrate to compensate for existing tolerances and thereby ensure low thermal resistance of the thermal interface, the biasing forces are applied through a backing frame that underlies and stabilizes the PCB substrate in the area of the component.

The specified height of the heat sink above the PCB is defined for each application in relation to a nominal height of the mounted heat generating component above the PCB, and is preferably chosen to be approximately equal to such a nominal height.

In other embodiments the specified height of the heat sink above the PCB is determined by means of standoffs of specified length being provided between the PCB and the heat sink and being formed integral with or separate from the heat sink.

A cooling principle according to the present invention offers a number of advantages, including:

- Compensates for variations due to mechanical tolerances, heat expansion etc. in heat sink, component holder, component, PBC and solder joints;
- Enables the application of controlled and uniform contact pressure even between a large and heavy heat sink and a comparatively small component; and thereby
- Allows for establishing good thermal contact between heat sink and component;
- Permits individual optimization of the heat sink for each component.
- The fastening arrangement occupies minimum board space;
- Low and predictable thermal resistance between the heat sink and the component, with low variations between individual boards;
- Mechanically robust, thereby meeting mechanical strength and endurance requirements with regard to vibration and shock (e.g. by transportation, office vibration or earthquake);

Advantages offered by the present invention, in addition to those described above, will be readily appreciated upon reading the below detailed description of embodiments of the invention.

BRIEF DESCRIPTION OF THE DRAWINGS

The invention, together with further objects and advantages thereof, will be best understood by reference to the following description taken together with the accompanying drawings, in which:

FIG. 2A is a partly schematical side view of a first practical example of a cooling assembly of the first embodiment mounted to the electronic application of FIG. 1;

FIG. 2B is a likewise partly schematical top view of the installation of FIG. 2A;

DETAILED DESCRIPTION

Figure 1:
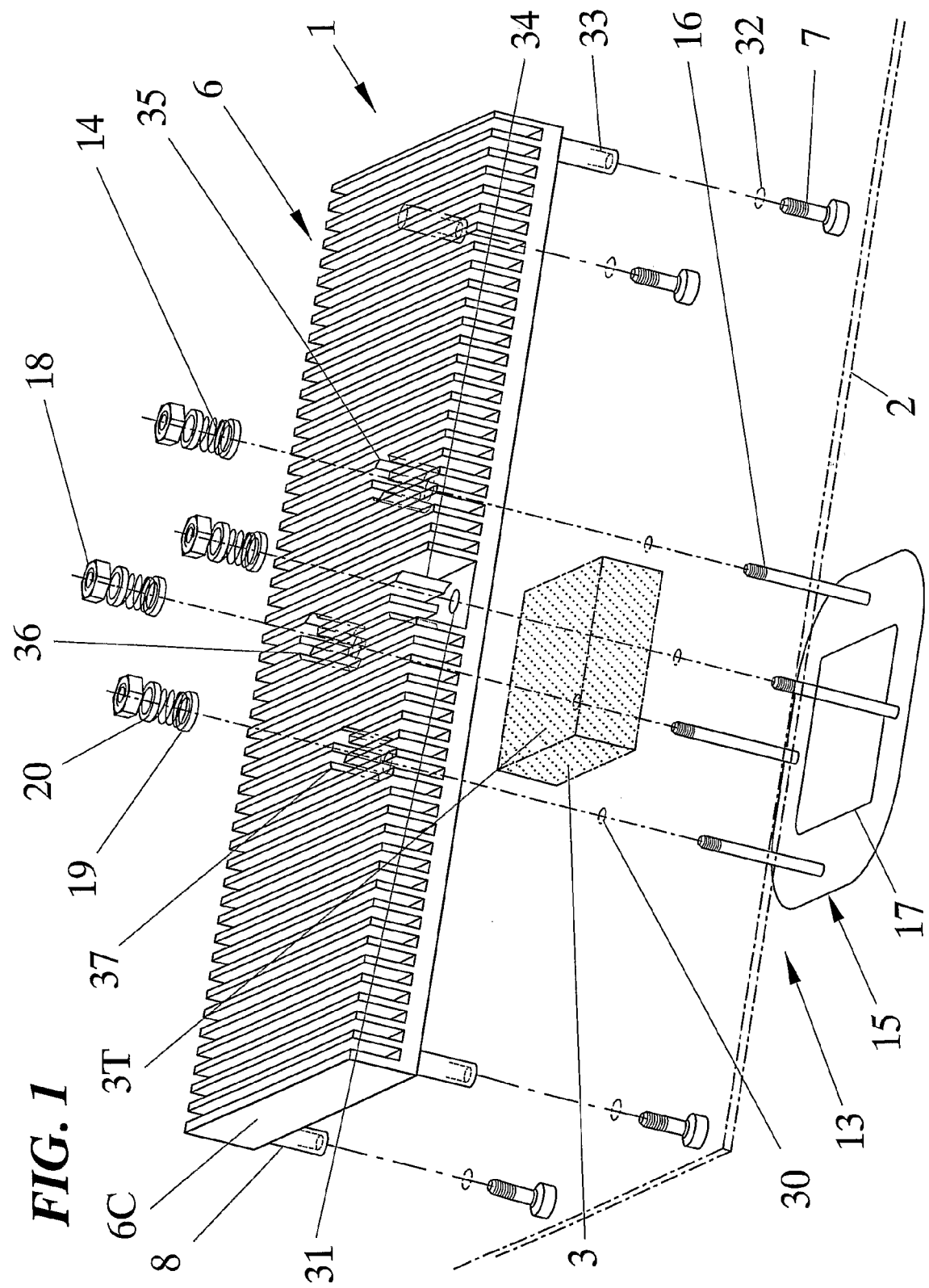
FIG. 1 is an exploded isometric view from above of a first embodiment of a cooling assembly for an electronic application, according to the invention.

The invention will now be explained with reference to embodiments that are illustrated in the accompanying drawing figures and that exemplify the use of the inventive cooling principles in electronic applications that include a cooling assembly attached to electronic equipment. A first exemplifying embodiment of the invention is illustrated in FIGS. 1 and 2A-B and relates to an electronic application 1 including a partially and very schematically outlined printed circuit board (PCB) on which is mounted a likewise schematically outlined electronic component 3 in the form of a processor or other highly heat generating component. It shall be emphasized, though that the illustrations are for the purpose of describing preferred embodiments of the invention and are not intended to limit the invention to the details thereof.

In this application 1, heat generated by the electronic component 3 is removed from the component 3 by means of a cooling assembly primarily consisting of a rigid heat sink 6 that is attached to the PCB 2 in heat transferring thermal contact with the heat generating electronic component 3 and from which heat is transferred away from the application 1 in an appropriate, not specifically illustrated manner, such as by means of forced air flow, heat pipes etc. A distinctive feature of the invention is that in the assembled application 1, outer areas of the heat sink 6 are secured to the circuit board 2 so that the heat sink 6 is held in a static or stationary position relative to the PCB and at a specified height L (see FIGS. 2A and 3B) above the printed circuit board 2. In particular, in the illustrated embodiment, the heat sink 6 is fixed to the circuit board 2 at discrete first positions 9-12 (see FIG. 2B) in the outer area of the heat sink, preferably in an outer peripheral area of the heat sink 6 with regard to its extension in a direction parallel to the circuit board 2, or expressed otherwise, close to the outer circumference 6C of the heat sink 6. The number of fixing positions 9-12 is four in the illustrated embodiment, but may be varied dependent upon the shape, size and/or weight of the heat sink used in each application. In any case, the number of and distribution of the first fixing positions 9-12 around the periphery of the heat sink 6 shall be sufficient to statically fix the heat sink in all directions relative to the PCB.

To serve the purposes of the invention, the heat sink 6 is rigid or stiff compared to the PCB substrate and with respect to the later discussed forces that are used to apply the required contact pressure between the heat sink 6 and the component 3. The heat sink 6 may preferably be made e.g. of extruded aluminum.

The heat sink 6 is fixed relative to the circuit board 2 with a lower thermal contact surface 6T (FIG. 2A) thereof being provided at a specified distance H above the level of the circuit board 2 at said first positions 9-12. Specifically, the heat sink 6 is positively fixed to the printed circuit board 2 by means of first attachments 7 that are here schematically illustrated as screw or bolt type fasteners. From the underside 2B of the PCB 2, with regard to the mounting of the component 3 thereon, said first attachments 7 are introduced through corresponding holes 32 in the PCB 2 and into engagement with threaded bores 33 (outlined in FIG. 1) formed in lower ends of standoffs 8 of specified length L, being provided between an upper surface 2C of the PCB 2 and a lower surface 6B of the heat sink 6 at the first positions 9-12. In the illustrated embodiment the standoffs 8 are formed integral with the heat sink 6, at each corner area of the generally rectangular heat sink 6.

The length L of these standoffs 8 determines the height of the secured heat sink 6 above the circuit board 2 at said first positions 9-12 and in the illustrated embodiment where the lower thermal contact surface 6T is at a level with a lower surface 6B of the heat sink 6 said heights L and H are equal. In variants of the heat sink, not illustrated, the thermal contact surface 6T may, however, be positioned at a different level, separated from the lower surface 6B of the actual heat sink 6, so that said heights L and H, respectively, differ. The length L of the standoffs 8 is chosen in relation to a nominal height HN (see FIG. 2A) of a thermal contact surface 3T of the mounted component 3 above the circuit board 2, and in the applicable case in relation to the relative positioning of the lower heat sink surface 6B and the thermal contact surface 6T, so that the height H of the thermal contact surface 6T is approximately equal to the nominal height HN of the component 3, for reasons that will be described further below. The associated thermal contact surfaces 6T, 3T of the heat sink 6 and the component 3, respectively, each have a substantial area permitting effective heat transfer from component 3 to heat sink 6. Said surfaces are preferably completely flat, as illustrated, but may alternatively have other complementary shapes allowing for an intimate parallel contact, such as concave and convex arcs of the same radius.

Furthermore, in accordance with the invention, the heat sink 6 is resiliently connected to the circuit board 2 through biasing forces F (see FIGS. 3B and 4B) applied between the heat sink 6 and the printed circuit board 2, with the heat sink 6 acting as a fixed anvil due to the fixed attachment thereof to the PCB at said first positions 9-12. The biasing forces F are applied to the PCB 2 in an area outside the heat generating component 3, preferably closely surrounding the component 3. Specifically, in the illustrated embodiment, the heat sink 6 is attached to the PCB 2 through a second attachment 13 resiliently connecting the heat sink 6 to the circuit board 2 at discrete second positions 21-24 just outside an outer circumference 3C (FIG. 2A) of the component 3.

Said second attachment 13 comprises a backing frame 15 that is provided on the underside 2B of the substrate of the PCB 2, i.e. on the opposite side of the circuit board 2 from the component 3, and aligned with the component. In order to lower the weight of the frame 16 it is preferably provided with a central cut-out 17 underlying the central area of the component 3. The backing frame carries a number of, in the illustrated embodiment four, bolt-like fasteners 16 extending upwardly therefrom and in the assembled condition being extended through associated apertures 30 formed in the circuit board 2. Preferably, said circuit board apertures 30 are evenly distributed around the outer circumference 3C of the heat generating component 3, and they are provided at locations corresponding to said second positions 21-24. The fasteners 16 extend further upwardly, through heat sink apertures 31 that in the assembled condition are aligned with the circuit board apertures 30 at said second positions 21-24.

At their portion protruding from the upper side of the heat sink 6, the fasteners 16 each carry an intermediary biasing means 14, here in the shape of a coil spring that on both sides is flanked by a washer 19 and 20, respectively. The distal end of the fasteners 16 carries a nut member 18 that during assembly will be tightened into indirect engagement, through the biasing means 14, with the heat sink 6 to apply the resilient biasing forces F to the circuit board 2 in the area of said component 3. The biasing means 14 and the nut members 18 are in their assembled condition accommodated in cut-outs 34-37 formed in the upper finned surface 6A of the heat sink 6. As will be described more closely below, the biasing forces F will be employed to secure the desired uniform contact and the required contact pressure between the thermal contact surfaces 6T, 3T of the heat sink 6 and the component 3, respectively.

Mounting of the cooling assembly 6-8 and 13 to the printed circuit board 2 will now be described. To secure the heat sink 6 to the circuit board 2 at the first positions 9-12, the heat sink 6 is first laid upside down so that the lower surface 6B thereof faces upwardly. The printed circuit board 2 is then positioned on the heat sink 6 with the mounted component 3 facing the lower surface 6B of the heat sink 6 and with the heat transfer contact surface 3T of the component 3 aligned with the thermal contact surface 6T of the heat sink 6. At said first positions 9-12, the first attachments 7 are extended through the apertures 32 in the circuit board 2, and are brought into engagement with the bores 33 of the standoffs 8. The first attachments 7 are then tightened to fix the heat sink 6 to the circuit board 2 in the stationary position with its lower thermal contact surface 6T being provided at the specified distance L, H from the circuit board 2 at said first positions 9-12. Depending upon the mechanical tolerances and especially upon the mounted position of the component 3 this tightening of the first attachments 7 to fix the heat sink 6 to the PCB 2, may result in a local elastic deformation of the PCB substrate or may leave a small gap between heat sink 6 and component 3, as will be described further below. However, reference is first made to FIG. 2A that illustrates an ideal case where the actual height HA of the contact surface 3T of the mounted component 3 above the PCB 2 is approximately equal to the nominal height HN and where there is parallelism between the contact surfaces 6T, 3T. In this case tightening of the first attachments 7 will bring the thermal contact surfaces 6T, 3T into intimate contact with each other, preferably through a gap filler material (not specifically shown) pre-applied to the component contact surface 3T, but without any significant elastic deformation of the PCB substrate.

With the heat sink 6 fixed to the PCB 2, the second attachment 13 is fitted at said second positions 21-24 by extending the bolt-like fasteners 16 through the circuit board apertures 30 until the backing frame 15 engages the underside 2B of the PCB 2. The whole application 1 is then turned over 180° and the biasing means 14 are placed over the free ends of the fasteners 16 that are extended through the apertures 31 and cut-outs 34-37 of the heat sink 6. Finally, the nuts 18 are brought into engagement with the fasteners 16 and are tightened with a specified torque R to establish the correct contact pressure between the heat sink 6 and the component 3.

Figure 3A:
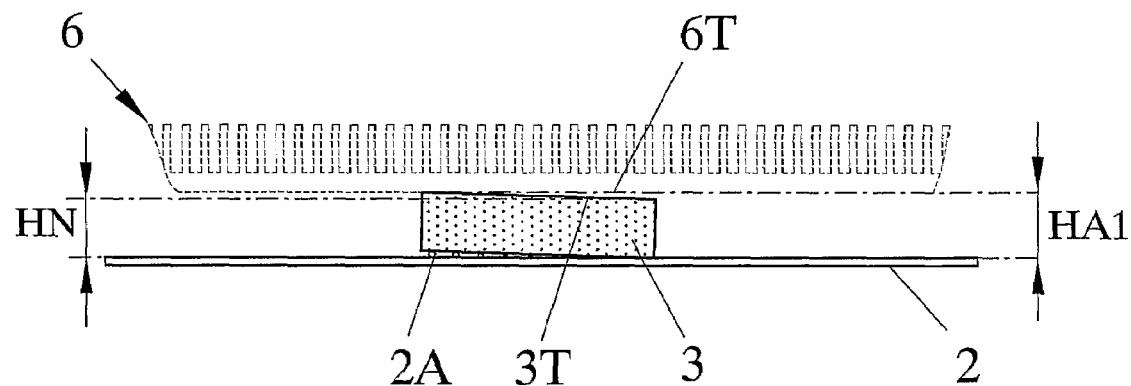
FIG. 3A is a schematical illustration that, greatly exaggerated, exemplifies a tilted component on a PCB of a variant of the electronic application of FIG. 2A-B, before mounting of the cooling assembly.
Figure 3B:
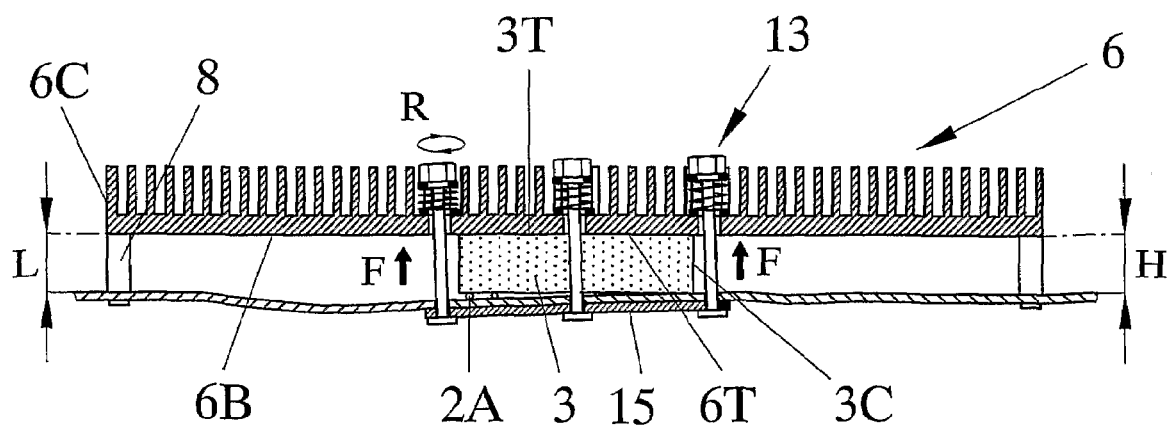
FIG. 3B is a schematical illustration, in a section taken along line A-A in FIG. 2B, that, likewise greatly exaggerated, illustrates a second practical example of the cooling assembly of the first embodiment mounted to the schematical electronic application of FIG. 3A.

A different practical situation is illustrated in FIGS. 3A-B. In this case the component 3 has been mounted with a tilt caused e.g. by improperly formed solder joints 2A and resulting in an actual maximum height HA1 of the component 3 that clearly exceeds the nominal height NH. It must be clarified though, that the tilt and height difference have been heavily exaggerated in FIGS. 3A-B (as well as in the later discussed FIGS. 4A-B and 6) and in practice amount to only fractions of the illustrated measurements.

In this case, FIG. 3A briefly illustrates the situation before tightening of the first attachments 7, namely the lack of parallelism between the contact surfaces 6T and 3T and the difference in height. The forces that are then applied through the first attachments 7 will in this situation cause downwardly directed flexing of the PCB substrate to accommodate the difference in height and lack of parallelism between the contact surfaces 6T, 3T of the heat sink 6 and the component 3, respectively, as is schematically illustrated in FIG. 3B. The flexing of the PCB effectively compensates for the tilt and height variations, partly due to the relatively large distance between the first and second positions 9-12 and 21-24, respectively. With the invention, the resiliency of the PCB 2 substrate will thus be employed to provide effective inherent and automatic compensation not only for assembly tolerances and manufacturing tolerances of parts of the equipment but also for dynamic dimensional changes during transport and operation of the application. The tightening of the second attachment 13, through the support of the backing frame 15, then provides the required resilient force F for achieving a controlled contact pressure between the heat sink 6 and component 3 surfaces 6T and 3T, respectively.

Figure 4A:
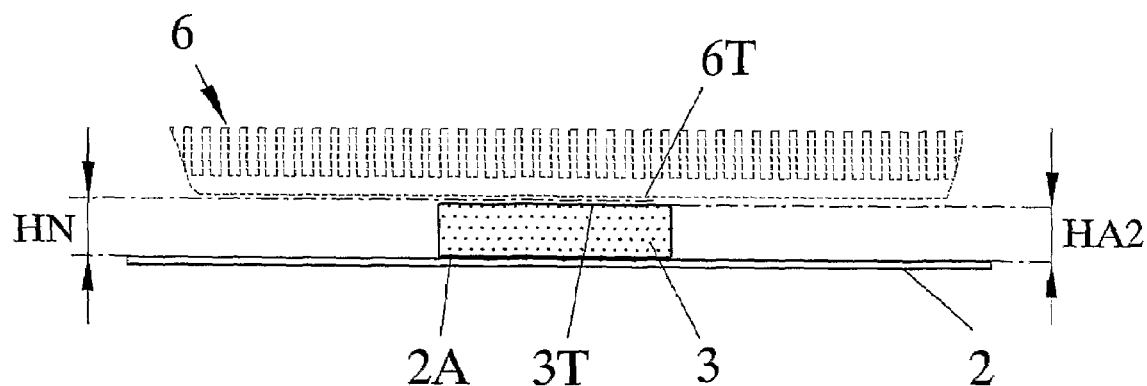
FIG. 4A is a schematical side view that, greatly exaggerated, exemplifies a component mounted at reduced height on a PCB of a further variant of the electronic application of FIG. 2A-B, before installing the cooling assembly.
Figure 4B:
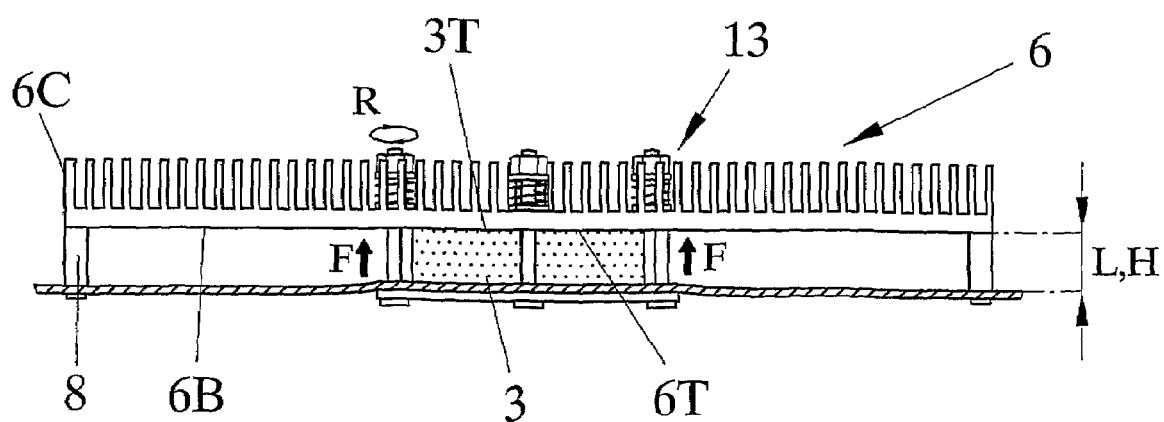
FIG. 4B is a side view that, likewise greatly exaggerated, illustrates a third practical example of the cooling assembly of the first embodiment mounted to the schematical electronic application of FIG. 4A.

A further practical situation when using the invention is illustrated in FIGS. 4A-B, where the actual height HA2 of the component contact surface 3T is smaller than the nominal height HN. FIG. 4A briefly illustrates the situation after tightening the first attachments 7. A small gap still exists between the contact surface 6T of the secured heat sink 6 and the component contact surface 3T. In this case, the resilient force F applied by tightening the second attachment 13 will, likewise through the support of the backing frame 15, first close the small gap between heat sink 6 and component 3 by upwardly directed elastic deformation of the PCB substrate, and will then provide the controlled uniform contact pressure between the heat sink and component surfaces 6T and 3T.

As described above, the invention will, through the local resilient deformation of the circuit board, provide automatic compensation for all mechanical manufacturing as well as assembly tolerances by compensating for e.g. discrepancies between said nominal height HN and an actual maximum height HA1, HA2 of the component 3 above said circuit board 2 as well as for lack of parallelism between the associated thermal contact surfaces 6T, 3T of the heat sink and the component, respectively. This will secure an initial exact assembly with controlled and uniform contact pressure between heat sink and component and likewise controlled thermal interface there between, to secure effective cooling of the electronic application. Through the fixed, stationary heat sink and the resilient biasing of the thermal interface, dynamic mechanical as well as thermal forces will likewise be absorbed without deteriorating or destroying the thermal interface.

Figure 5A:
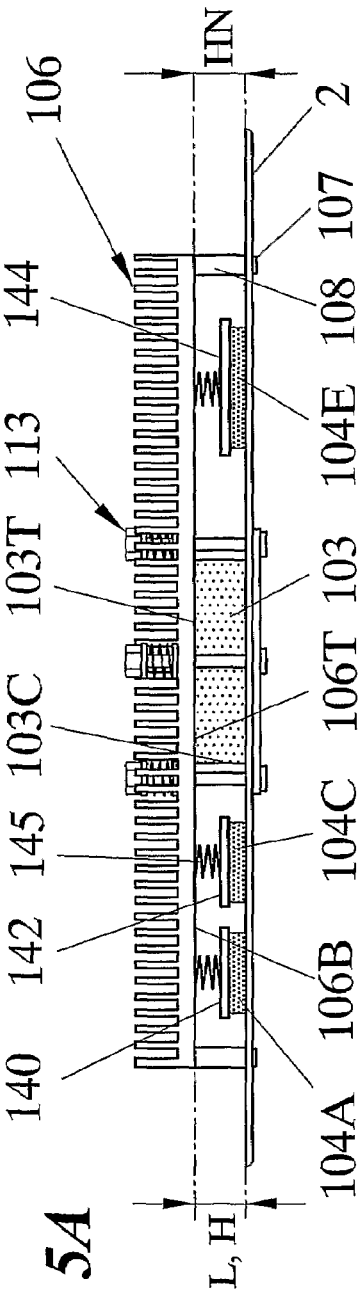
FIG. 5A is a partly schematical side view of a second embodiment of a cooling assembly mounted to an alternative electronic application, according to the invention.
Figure 5B:
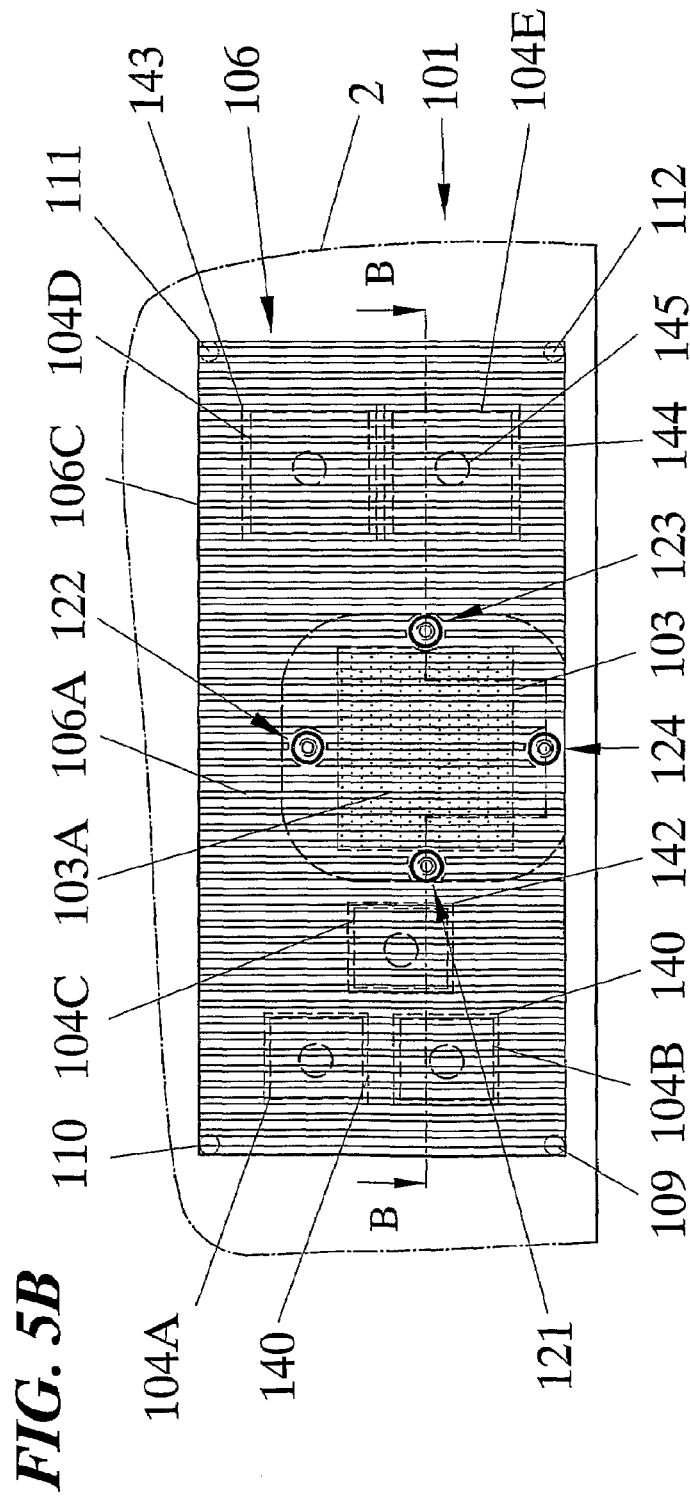
FIG. 5B is a likewise partly schematical top view of the assembly of FIG. 4A.

A second embodiment of the present invention will now be described with specific reference to the electronic application 101 illustrated in FIGS. 5A-B and 6. Here, the cooling assembly likewise consists of a large heat sink 106, the standoffs 108 and the first and second attachments 107 and 113, respectively, for attaching the heat sink 106 to the printed circuit board 2 at a specified distance L above the PCB 2. In this case, however, a number of, in the illustrated embodiment five, secondary heat generating electronic components 104A-E are mounted on the printed circuit board 2, within the projected area 106A of the main heat sink 106. Secondary heat sinks 140-144 are pressed into contact with the respective secondary component 104A-E by means of a resilient support member 145 that is here schematically illustrated as a spring. In the mounted condition the springs 145 act between an underside 106B of the heat sink 106 that in a mounted condition faces the circuit board 2 and the respective secondary heat sink 140-144, and apply a force F' that biases the associated heat sink 140-144 into heat transferring thermal contact with the respective secondary component 104A-E. Like in the first embodiment, the heat sink 106 is here too in substantial heat transferring thermal contact with only one main heat generating electronic component 103 on the printed circuit board 2. While allowing close mounting of several components, the design thus still permits individual optimization of heat sinks for each component. In this second embodiment of the cooling assembly 106-108, 113 it is even more essential to attach the heat sink 106 to the circuit board 2 only at the discrete first positions 109-112 close to the outer circumference 106C of the heat sink 106 and at the discrete second positions 121-124 outside the outer circumference 103C of the component 103, so that substantial free space remains between the heat sink 106 and the circuit board 2 to allow free flow of cooling air past the first and second attachments 107 and 113, respectively. Since the large heat sink 106 is not in any substantial heat transferring contact with any of the secondary heat sinks 140-144, the heat generated by them must be transferred from the application 101 by such cooling air flow.

The mounting of the cooling assembly 106-108, 113 is the same as for the first embodiment, with the exception that before positioning the printed circuit board 2 on the heat sink 106 lying upside down, the secondary heat sinks 140-144 are secured to the respective secondary heat-generating electronic component 104A-E by means of a suitable thermal interface material (not specifically illustrated) and the resilient support members 145 are set in position in associated countersunk areas (likewise not specifically illustrated) in the underside 106B of the heat sink 106. By means of the resilient support members 145 the secondary heat sinks 140-144 will be pressed with the force F' towards the respective secondary components 104A-E. Through this "floating" support of the secondary heat sinks 140-144 with regard to the heat sink 6, the controlled pressure will compensate not only for mechanical manufacturing and assembly tolerances but also for the deformation of the PCB substrate caused by the first and/or second attachments 107, 113.

The conventional problem in using one heat sink for several components is that the heat sink is warmed up by all components, which means that it is difficult to make thermal calculations. The components may also work at different operating temperatures and it may be OK for one component to be hotter then another one. This means that the heat sink must be dimensioned to keep the temperature of the most sensitive component down. With the modified design of this suggested solution it is possible to use one large heat sink to cool a main component and to use thermally isolated heat sinks cooling several further components on the PCB in order to save PCB area and permit components to be closely mounted. Only one component is thermally connected to each heat sink and this makes it possible to adapt each heat sink/component individually with respect to mechanical tolerance.

Figure 6:
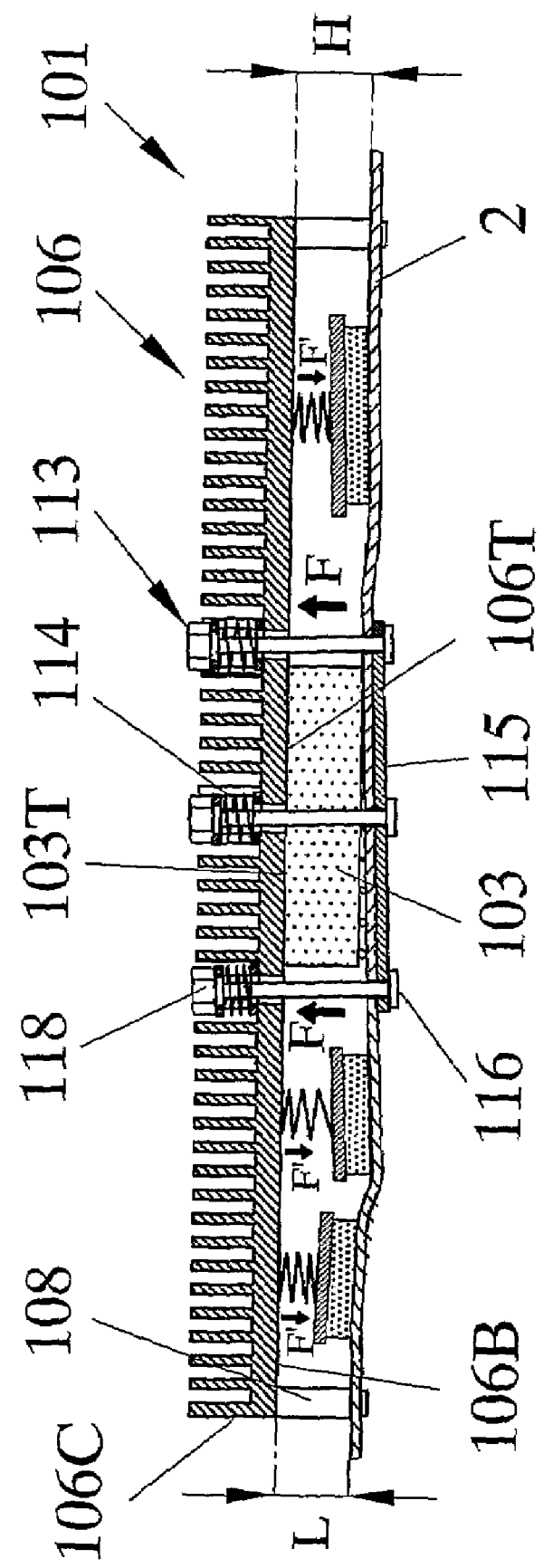
FIG. 6 is a schematical illustration, in a section taken along line B-B in FIG. 5B, that, greatly exaggerated, exemplifies a practical example of the cooling assembly of the second embodiment mounted to the electronic application of FIG. 5A, having a tilted component mounted on a PCB.

FIG. 6 is an illustration of the second embodiment of the cooling assembly 106-108, 113 secured to an electronic application 101 in a situation that with regard to the mechanical tolerances of the main heat sink 106 and the mounted main component 103 resembles the one depicted in FIG. 3B. The illustration clarifies the above discussed advantages of this second embodiment with regard to the compensation for mechanical tolerances of both the main and the secondary heat sinks and components.

In all of the above discussed embodiments of the invention, the heat sink that is in thermal contact with the main heat generating component 3, 103 is illustrated as being a large and heavy sink 6, 106 having an upper surface 6A, 106A that, projected on the circuit board 2, has an area being several times larger than that of an upper surface 3A, 103A of the associated electronic component 3, 103. This is the type of situation where shock and vibration would cause the greatest dynamic problems in the thermal interface of conventional assemblies and where the application of the principles of the invention will have the greatest effect. Additionally, this is also the situation where the invention is most favourable, in terms of the available large distance between the first and second attachment positions and the associated large area in which the resiliency of the circuit board substrate may be employed to provide the automatic compensation for tolerances in height and parallelism. Notwithstanding the above, the invention is not restricted to any specific size of the heat sink, but may theoretically be used in and covers any application were there is sufficient space available for providing the separate first and second attachments.

In alternative, but not specifically illustrated embodiments of the invention variations of the different illustrated parts of the cooling assembly may be employed without departing from the scope of the invention. One example thereof is the use of standoffs that are separate from the actual heat sink so that the appropriate standoff length may be chosen for several applications where one and the same heat sink design may be used. A similar result may be obtained for a heat sink design having integral standoffs, in case thin "shims" are interposed between the standoffs and the PCB in order to achieve a desired height of the heat sink contact surface for each application. Specifically, the invention also covers the possibility of using other designs of the first and second attachments, and not least other biasing means thereof, than the ones specifically illustrated as examples herein.

The invention has been described in connection with what is presently considered the most practical and preferred embodiments, but it is to be understood that the invention is not limited to the disclosed embodiments. The invention is therefore intended to cover various modifications and equivalent arrangements included within the spirit and scope of the appended claims.

The invention claimed is:

1. A method of cooling an electronic application having at least one heat-generating electronic component mounted on a printed circuit board, by means of a cooling assembly including a heat sink attached to the circuit board in heat transferring thermal contact with one heat generating electronic component, comprising the steps of:

securing an outer area of the heat sink to the circuit board at a specified height above the circuit board and in a stationary position relative thereto; and applying biasing forces between the heat sink and the circuit board outside the component and through the heat sink acting as a fixed anvil;

thereby enabling local resilient deformation of the circuit board in directions generally toward or away from the heat sink and establishing uniform and controlled contact pressure to ensure low thermal resistance between the heat sink and the component.

2. The method according to claim 1, further comprising the step of securing the heat sink to the circuit board at discrete first positions in the outer area of the heat sink, fixed relative to the circuit board at said positions and with a lower thermal contact surface thereof being provided at a specified distance above the level of the circuit board at said first positions.

3. The method according to claim 2, further comprising the step of securing the heat sink to the circuit board in an outer peripheral area of the heat sink extending in a direction parallel to the circuit board and by applying the biasing forces at discrete second positions closely surrounding the component.

4. The method according to claim 2, further comprising the step of determining the height of the lower thermal contact surface of the secured heat sink above the circuit board at said first positions in relation to a nominal height of a thermal contact surface of the mounted component above the circuit board.

5. The method according to claim 1, further comprising the step of applying the biasing forces through a backing frame that underlies the circuit board at a position of the heat generating component.

6. The method according to claim 2, further comprising the step of selecting a number of and a distribution of discrete first positions around the periphery of the heat sink dependent upon the shape, size or weight of the heat sink used in each application to statically fix the heat sink in all directions relative to the circuit board.

7. An electronic application comprising a circuit board, at least one heat-generating electronic component mounted thereon, and a cooling assembly comprising at least one rigid heat sink being in heat transferring thermal contact with a heat generating electronic component on the circuit board, wherein an outer area of the heat sink is secured to the circuit board in a statically fixed, stationary position relative thereto and at a specified height above the circuit board and in that the statically fixed heat sink is resiliently attached through a biasing force to the circuit board in an area outside the component.

8. The electronic application according to claim 7, wherein the heat sink is secured to the circuit board at first discrete positions in an outer peripheral area of the heat sink, close to an outer circumference thereof with regard to its extension in a direction parallel to the circuit board, and in that a lower thermal contact surface thereof is provided at a specified distance above the level of the circuit board at said positions.

9. The electronic application according to claim 8, wherein the height of the lower thermal contact surface of the secured heat sink above the circuit board at said first positions is approximately equal to a nominal height of a thermal contact surface of the mounted component above the circuit board.

10. The electronic application according to claim 7, wherein the heat sink is resiliently attached to the circuit board at discrete second positions closely surrounding the component.

11. The electronic application according to claim 7, wherein first attachments positively fix the heat sink to the circuit board at first positions in said outer area thereof and by a second attachment resiliently connecting the heat sink to the circuit board at second positions outside an outer circumference of the component.

12. The electronic application according to claim 7, wherein the heat sink is rigid compared to the circuit board and with respect to the biasing forces applying a required contact pressure between heat sink and component.

13. The electronic application according to claim 8, wherein the cooling assembly comprises standoffs of specified length determining the height of the heat sink thermal contact surface above the circuit board at said first positions.

14. The electronic application according to claim 12, wherein the second attachment comprises intermediary biasing means applying a contact pressure between the thermal contact surfaces of the heat sink and the component.

15. The electronic application according to claim 12, wherein the second attachment comprises a backing frame provided on an opposite side of the circuit board from the component and carrying fasteners introduced through associated circuit board apertures and heat sink apertures at said second positions through intermediary biasing means and into engagement with nut members, and in that said nut members are tightened into indirect engagement, through the biasing means, with the rigid heat sink, applying a resilient biasing force to the circuit board in the area of said component, said force causing an upwardly or alternatively downwardly directed local flexing of the circuit board for taking up tolerances in thermal contact surfaces, parallelism and component height above the circuit board.

16. The electronic application according to claim 7, wherein projected on the circuit board the heat sink has an area that is larger than that of the associated electronic component.

17. The electronic application according to claim 7, wherein the heat sink is in substantial heat transferring thermal contact with only one heat generating electronic component on the printed circuit board.

18. The electronic application according to claim 7, wherein the main heat sink is in heat transferring thermal contact with a main heat generating electronic component on the printed circuit board and by at least one secondary heat sink that is provided on an underside of the main heat sink that faces the circuit board, and that through a resilient support is biased into heat transferring thermal contact with a respective secondary heat-generating electronic component on the printed circuit board.

19. A cooling assembly for cooling an electronic application of at least one heat generating electronic component mounted on a circuit board, including a heat sink having a thermal contact surface for making heat transferring thermal contact with a heat generating electronic component said cooling assembly comprising:
  first attachments for engaging the heat sink in an outer area thereof with regard to said heat transferring contact between the heat sink and a component, and for securing the heat sink to the circuit board in a statically fixed position relative thereto, at a specified height above the circuit board; and
  a second attachment having intermediary biasing means for resiliently attaching the statically fixed heat sink to the circuit board through biasing forces in an area thereof outside said heat transferring thermal contact.

20. The cooling assembly according to claim 19, wherein the heat sink has a major extension parallel to said thermal contact surface and is rigid compared to the circuit board and with respect to the biasing forces applying the required contact pressure between heat sink and component and in that said first attachments engage the heat sink at discrete first positions in an outer peripheral area, close to an outer circumference thereof.

21. The cooling assembly according to claim 19, wherein standoffs of specified length for determining the height of the thermal contact surface of the secured heat sink above the circuit board.

22. The cooling assembly according to claim 19, wherein the heat sink on an underside thereof that in a mounted condition faces the circuit board, engages at least one secondary heat sink through a resilient support for biasing said secondary heat sinks into heat transferring thermal contact with a respective secondary heat-generating electronic component in the mounted condition.

23. The cooling assembly according to claim 19, wherein the second attachment comprises a backing frame for engaging a circuit board at an opposite side thereof from the position of a heat generating component and carrying bolt-like fasteners for insertion through associated apertures in the heat sink at said second positions, through said intermediary biasing means and into engagement with nut members for indirectly engaging the heat sink.

24. A method of mounting a cooling assembly, to a circuit board for cooling an application of at least one heat generating electronic component mounted on the circuit board through heat transferring thermal contact between a rigid heat sink of the assembly and one component, said method comprising the steps of:
  securing the heat sink to the circuit board at first positions spaced outwardly from its contact with the electronic component, so as to be statically fixed relative thereto with a lower thermal contact surface thereof being provided at a specified distance from the circuit board at said positions; and
  attaching the statically fixed heat sink to the circuit board through a biasing force at second positions closely surrounding the electronic component.

25. The method according to claim 24, further comprising the steps of:
  positioning the printed circuit board on the heat sink with the mounted component facing a lower surface of the heat sink and with a thermal contact surface thereof aligned with the thermal contact surface of the heat sink;
  fitting first attachments by extending the attachments through the circuit board at said first positions, bringing the attachments into engagement with the heat sink, and tightening the attachments to fix the heat sink to the circuit board in a stationary position with the lower thermal contact surface thereof being at a specified height above the circuit board at said positions;
  fitting a second attachment by extending the second attachment through the circuit board and through the heat sink, bringing the second attachment into engagement with the circuit board and the heat sink, and tightening the second attachment through biasing means to introduce a resilient biasing force to the heat sink and the circuit board for applying contact pressure between the heat transfer surfaces of the heat sink and the component.

* * * * *